United States Patent
Choi et al.

(10) Patent No.: US 8,822,127 B2
(45) Date of Patent: Sep. 2, 2014

(54) PHOTOSENSITIVE RESIN COMPOSITION FOR BLACK MATRIX

(75) Inventors: Dong Chang Choi, Daejeon (KR); Kyung Soo Choi, Hanam-si (KR); Ho Chan Ji, Daejeon (KR); Geun Young Cha, Daejeon (KR); Sung-Hyun Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 208 days.

(21) Appl. No.: 12/997,224

(22) PCT Filed: Sep. 28, 2009

(86) PCT No.: PCT/KR2009/005544
§ 371 (c)(1),
(2), (4) Date: Dec. 9, 2010

(87) PCT Pub. No.: WO2010/036080
PCT Pub. Date: Apr. 1, 2010

(65) Prior Publication Data
US 2011/0101268 A1    May 5, 2011

(30) Foreign Application Priority Data

Sep. 26, 2008 (KR) .................. 10-2008-0094452
Sep. 28, 2009 (KR) .................. 10-2009-0092063

(51) Int. Cl.
*G03F 7/004* (2006.01)
*G03F 7/027* (2006.01)
*G02F 1/13* (2006.01)

(52) U.S. Cl.
USPC .................. 430/270.1; 430/20; 430/281.1

(58) Field of Classification Search
USPC .................. 430/7, 20, 270.1, 281.1
See application file for complete search history.

(56) References Cited

U.S. PATENT DOCUMENTS 6,858,370 B2 * 2/2005 Kodama et al. ............ 430/270.1
7,790,351 B2 * 9/2010 Fukuhara et al. .......... 430/270.1
2006/0229376 A1 * 10/2006 Hayashi et al. ................ 522/6
2007/0134590 A1   6/2007 Fukuhara et al.
2007/0263018 A1 * 11/2007 Vanini ............................ 347/1

FOREIGN PATENT DOCUMENTS

| JP | 2002-182388 A | 6/2002 |
|---|---|---|
| JP | 2003-302515 A | 10/2003 |
| JP | 2007-219499 A | 8/2007 |
| JP | 2008-233434 A | 10/2008 |
| JP | 2008-268894 | 11/2008 |
| JP | 2010-032940 | 2/2010 |
| KR | 102002-0075502 A | 10/2002 |
| KR | 10-2004-0101065 A | 12/2004 |
| KR | 10-2006-0086999 A | 8/2006 |
| KR | 1020060086999 A * | 8/2006 |
| KR | 10-2006-0131669 A | 12/2006 |
| KR | 10-2007-0080619 A | 8/2007 |
| KR | 10-2008-0023649 A | 3/2008 |
| WO | 00-40632 A1 | 7/2000 |

OTHER PUBLICATIONS

Jeong et al., KR10-2006-0086999 A, English Translation, Aug. 2006.*
Machine translation JP 2008-268894, published on Nov. 6, 2008.*
Chinese Office Action dated May 3, 2012 for Chinese Application No. 200980113036.8, 15 pages.
Japanese Office Action dated Apr. 24, 2012 for Japanese Application No. 2010-542185, 3 pages.

* cited by examiner

*Primary Examiner* — Anca Eoff
(74) *Attorney, Agent, or Firm* — Rothwell, Figg, Ernst & Manbeck, P.C.

(57) ABSTRACT

A photosensitive resin composition for a black matrix and a black matrix formed with the same are provided. The photosensitive resin composition for a black matrix includes a solvent consisting of 5-30 weight % of a first solvent having a boiling point of 110-159° C., 55-90 weight % of a second solvent having a boiling point of 160-200° C., and 3-15 weight % of a third solvent having a boiling point of 201-280° C., and the first solvent, the second solvent, and the third solvent are an aliphatic compound and use at least one solvent composition selected from a group consisting of alkyl ester, alkyl ketone, alkyl ether, and alkyl alcohol, and thus a uniform thin film having no surface defect can be obtained, and the photosensitive resin composition has an excellent process property while securing a high light shielding property and thus a black matrix pattern having a few defect can be obtained, and is thus useful for a liquid crystal display.

7 Claims, 2 Drawing Sheets

PHOTOSENSITIVE RESIN COMPOSITION FOR BLACK MATRIX

CROSS REFERENCE TO RELATED APPLICATIONS

This application is a 35 U.S.C. §371 National Phase Entry Application from PCT/KR2009/005544, filed Sep. 28, 2009, and designating the United States, which claims priority under 35 U.S.C. §119 to Korean Patent Application No. 10-2008-0094452 filed Sep. 26, 2008 and to Korean Patent Application No. 10-2009-0092063 filed Sep. 28, 2009, which are incorporated herein in their entireties.

TECHNICAL FIELD

The present invention relates to a black matrix photosensitive resin composition for a liquid crystal display and a black matrix comprising the same, and more particularly, to a black matrix photosensitive resin composition, a black matrix formed with the same, and a liquid crystal display using the same. The photosensitive resin composition for a black matrix is especially suitable for a big screen television that requires a brighter backlight because of its high light shielding property and excellent surface characteristic, which are imparted by using a specific solvent composition.

BACKGROUND ART

In general, a black pattern in lattice form called a black matrix is disposed between color pixels of a color filter in order to improve contrast. In a conventional black matrix, a method of forming a pattern by depositing and etching chrome (Cr) as a pigment in an entire glass substrate was used, but a high cost is required in a process, a problem of a high reflectivity of chrome and a problem of environmental pollution due to a chrome waste fluid occur.

Due to such a reason, a study of a black matrix using a pigment dispersion method that can perform a minute processing has been actively performed and a study of producing a black composition with a coloring pigment in addition to carbon black has been performed, but because a coloring pigment in addition to carbon black has a weak light shielding property, a combination amount thereof should be very much increased and thus a viscosity of the composition increases, whereby it is difficult to handle the composition and strength of a formed film or a close contact property with a substrate is remarkably deteriorated.

Nowadays, as a request for improving performance in a photosensitive resin composition industry, many studies for a photosensitive resin composition have been performed and for example, there are a color filter composition, to which a binder is applied, which is newly developed for improving sensitivity, a black matrix resin composition having improved sensitivity by using a high sensitivity photopolymerization initiator, and a black matrix resin composition having improved sensitivity by injecting a photopolymerization initiator and an organic phosphate compound to the composition.

Nowadays, in a flat panel display field, a market share of a liquid crystal display (LCD) sharply increases. The LCD mainly used for an existing medium size or small size mobile display and monitor has been used for a big screen monitor and television. As a size of a screen increases, high sensitivity is requested to shorten a process time. Further, as a size of a screen increases, a brighter backlight is employed to solve brightness problem. As the backlight becomes bright, in a black matrix, a higher light shielding characteristic different from an existing light shielding characteristic is requested.

Therefore, as a content of carbon black, a pigment used in a composition to improve a light shielding characteristic, continuously increases, a process characteristic of a black matrix is continuously deteriorated and thus a process margin is lowered and many failures occur at each process stage, and thus a production yield is deteriorated.

Defects caused in each process due to the increase of the amount of carbon black used to improve a light shielding property include a defect or stain fatally occurring at a vacuum dry step (VCD process); pin stain occurring at a pre-bake step; chuck stain occurring at an exposure step; and developing stain, pattern separation, remainder, and a projection occurring at a developing step.

In the photosensitive composition industry, as an effort for reducing a processing time to increase a production yield, a process equipment is adjusted to approach a limit value and thus a standard required for a photosensitive composition is further raised.

In Korean Unexamined Patent Application Publication No. 2006-86999, in a photosensitive resin composition comprising a binder polymer, a polymerization compound having an ethylenically unsaturated bond, a photoinitiator, and a solvent, (i) at least one solvent selected from a first solvent group having a boiling point range of 140-159° C.; (ii) at least one solvent selected from a second solvent group having a boiling point range of 160-179° C.; and (iii) at least one solvent selected from a third solvent group having a boiling point range of 180-200° C., are used as a solvent, and a photosensitive resin composition in which the ratio of the first solvent: the second solvent: and the third solvent are 50-90 weight %: 10-40 weight %: 2-40 weight % is disclosed.

However, since the photosensitive resin composition disclosed in Korean Unexamined Patent Application Publication No. 2006-86999, contains the first solvent having a relatively low boiling point in a large amount of 50-90 weight % of the entire solvent, it cannot be used for a black matrix of uniform thin film having no surface defect and can only be used for a color filter. Actually, all exemplary embodiments of Korean Unexamined Patent Application Publication No. 2006-86999 describe only a composition for color filters and no example describes application to a black matrix.

DISCLOSURE

Technical Problem

The present invention has been made in view of the above problems, and provides a specific combination of a solvent for a photosensitive resin composition to produce a black matrix having an excellent processing property and having a high light shielding property with almost no defects.

Technical Solution

After studying each of the components used in a black matrix photosensitive resin composition, the present inventors have found that it is a solvent composition that changes a lot during a manufacturing process and that is a major factor for determining surface rheology of a film during the formation of the film. Therefore, a solvent ratio change speed, a solvent evaporation speed, and compatibility among components in the composition need to be controlled at each processing step to obtain a uniform film. The present invention, thus, was completed by finding a solvent composition providing a superior processability and thereby reducing defects caused by the conventional photosensitive resin composition.

Specifically, by minimizing the content of the first solvent having a relatively low boiling point and limiting the solvents to ones that are selected from the group consisting of alkyl ester, alkyl ketone, alkyl ether, and alkyl alcohol, a dispersion property of a composition can be maximized, thereby obtaining a uniform film with almost no defects.

Therefore, the present invention provides a black matrix photosensitive resin composition having a high light shielding property, which can be used under a process condition tuned to a limit value in order to maximize a production, a black matrix that is formed with the black matrix photosensitive resin composition and has almost no defects, and a liquid crystal display comprising the black matrix.

Advantageous Effects

According to the present invention, when producing a black matrix photosensitive resin composition, by limiting a solvent composition ratio, a uniform film with almost no surface defects can be obtained even under a reinforced process condition and an excellent process characteristic is obtained while securing a high light shielding property and thus a black matrix pattern having less defects can be obtained, thereby being useful for a liquid crystal display.

BEST MODE

In order to achieve the object, a black matrix photosensitive resin composition of a high light shielding property according to the present invention includes a solvent consisting of 5-30 weight % of a first solvent having a boiling point of 110-159° C., 55-90 weight % of a second solvent having a boiling point of 160-200° C., and 3-15 weight % of a third solvent having a boiling point of 201-280° C., and the first solvent, the second solvent, and the third solvent are at least one selected from an aliphatic compound.

Hereinafter, the present invention will be described in detail as follows.

The present invention is characterized in having no surface defect in a photosensitive resin composition for a general black matrix including a coloring agent, a binder resin, a polyfunctional monomer, a photopolymerization initiator, and a solvent, and especially adjusting a composition of a solvent to have a high light shielding property, and each composition will be described in detail hereinafter.

(a) Solvent

In the present invention, in order to have no surface defect and a high light shielding property, it is necessary to especially adjust a composition of a solvent in a black matrix photosensitive resin composition. Therefore, in the present invention, the black matrix photosensitive resin composition includes a solvent consisting of 5-30 weight % of a first solvent having a boiling point of 110-159° C., 55-90 weight % of a second solvent having a boiling point of 160-200° C., and 3-15 weight % of a third solvent having a boiling point of 201-280° C., and the first solvent, the second solvent, and the third solvent are at least one selected from an aliphatic compound.

Specifically, the aliphatic compound uses at least one selected from a group consisting of alkyl ester, alkyl ketone, alkyl ether, and alkyl alcohol.

Particularly, conventionally, in a solvent evaporation process (VCD process), in order to evaporate a large amount of solvent, the first solvent, which is a solvent having a relatively low boiling point should be much used. Accordingly, in the VCD process, there is a problem that a lot of defects occur in a surface of a thin film, and particularly, when a black matrix has a surface defect, the black matrix cannot be used.

Therefore, in the present invention, the thin film of a black matrix has no defect surface by allowing the first solvent having a relatively low boiling point to have a minimum content. That is, it is a very important factor in a composition of a black matrix to optimize a composition of a solvent so that the thin film surface has no defect, and in the present invention, a specific composition ratio of a solvent is developed.

Therefore, when a use amount of a solvent according to the present invention is assumed as 100 weight %, if a use amount of the first solvent is less than 5 weight %, a decompression dry time is extended and this a process time is extended, whereby productivity is deteriorated, and if a use amount of the first solvent exceeds 30 weight %, an amount of a solvent of a low boiling point is excessive and thus when a pressure is suddenly decompressed, volatilization of a solvent is excessive, whereby a defect undesirably occurs on a surface of the thin film.

A specific example of the first solvent according to the present invention is preferably at least one selected from a group consisting of methyl-3-methoxy propionate, ethyleneglycol methylether, ethyleneglycol ethylether, ethyleneglycol diethylether, dibutylether, ethylpyruvate, propyleneglycol methylether, propyleneglycol methylether acetate, n-butylacetate, isobutylacetate, amylacetate, isoamylacetate, butylpropionate, isoamylpropionate, ethylbutyrate, propyl butyrate, methyl-3-methoxyisobutyrate, methylglycolate, methyl lactate, ethyl lactate, methyl-2-hydroxyisobutyrate, ethylethoxyacetate, 2-methoxy ethylacetate, ethyleneglycolmethyletheracetate, 2-ethoxyethylacetate, dibutylether, cyclopentanone, cyclohexaneone, 2-hexaneone, 3-hexaneone, 5-methyl-2-hexaneone, 2-heptanone, 3-heptanone, 4-heptanone, 2-methyl-3-heptanone, 1-methoxy-2-propanol, ethyl-2-hydroxy propionate, and ethyl-3-methoxy propionate, but any component belonging within the above temperature range can be used.

A specific example of the second solvent according to the present invention is preferably at least one selected from a group consisting of 2-methoxy ethylether, 3-methoxybutylacetate, 2-ethoxyethyl ether, 2-butoxyethanol, 3-ethoxy-propanol, diethyleneglycoldodecylether, dipropyleneglycolmethylether, 2,6-dimethyl-4-heptanone, 2-octanone, 3-octanone, 3-nonanone, 5-nonanone, 4-hydroxy-4-methyl-2-pentanon, 2-methylcyclohexaneone, 3-methylcyclohexaneone, 4-methylcyclohexaneone, 2,6-dimethylcyclohexaneone, 2,2,6-trimethylcyclohexaneone, cycloheptanone, hexylacetate, amylbutyrate, isopropyl lactate, butyllactate, ethyl-3-hydroxybutyrate, ethyl-3-ethoxypropionate, ethyl-3-hydroxy butyrate, propyl-2-hydroxy-propionate, propyleneglycoldiacetate, propyleneglycolbutylether, propyleneglycol methylether propionate, diethyleneglycol dimethyl ether, diethyleneglycol dimethyl ether acetate, dipropyleneglycolmethylether, dipropyleneglycoldimethylether, ethyleneglycolbutylether, diethyleneglycolmethylethylether, ethyleneglycolmethylisopropylether, diethyleneglycoldiethylether, butylbutyrate, ethyl-3-ethoxypropionate, diethyleneglycolmonomethylether, 4-ethylcyclohexaneone, and 2-butoxyethylacetate, but any component belonging within the above temperature range can be used.

A specific example of the third solvent according to the present invention is preferably at least one selected from a group consisting of diethyleneglycolmonoethyl ether, butyrolactone, hexylbutyrate, diethyleneglycolmethyletheracetate, diethyleneglycolbutyl methyl ether, tripropylglycoldimethyl ether, triethyleneglycoldimethylether, diethyleneglycolethyletheracetate, diethyleneglycolbutyletheracetate, 3-epoxy-1,2-propanediol, ethyl-4-acetyl butyrate, diethyleneglycolmonobutylether, tripropylglycolmethyl ether, diethyleneglycol, 2-(2-butoxyethoxy)ethylacetate, catechol, triethyleneglycol methyl ether, diethyleneglycoldibutylether, triethyleneglycol ethylether, diethyleneglycolmonohexylether, triethyleneglycol butyl methyl ether, triethyleneglycolbutylether, tripropylglycol, and tetraethyleneglycoldimethylether, but any component belonging within the above temperature range can be used.

The first solvent, the second solvent, and the third solvent constituting a solvent of the present invention are an aliphatic compound selected from a group consisting of alkyl ester, alkyl ketone, alkyl ether, and alkyl alcohol, and it is preferable to use solvents having polarity in consideration of a dispersion property of a pigment included in a black matrix composition, and because an aromatic solvent including a benzene ring has no polarity, a pigment dispersion property may be undesirably deteriorated.

It is preferable for a slit cotter of a large area that a solvent according to the present invention consisting of the above-described component is included as 70-90 weight % of 100 weight % of the black matrix photosensitive resin composition, but it does not limit a coating method.

(b) Coloring Dispersion

In the present invention, a coloring dispersion liquid including a coloring agent is used as a black pigment of a black matrix photosensitive resin composition.

The black pigment uses a coloring dispersion liquid generated by mixing carbon black and at least two coloring pigments. As usable carbon black, shisuto 5HIISAF-HS, shisuto KH, shisuto 3HHAF-HS, shisuto NH, shisuto 3M, shisuto 300HAF-LS, shisuto 116HMMAF-HS, shisuto 116MAF, shisuto FMFEF-HS, shisuto SOFEF, shisuto VGPF, shisuto SVHSRF-HS, and shisuto SSRF of Tokai Carbon CO. LTD.; diagram black II, diagram black N339, diagram black SH, diagram black H, diagram LH, diagram HA, diagram SF, diagram N550M, diagram M, diagram E, diagram G, diagram R, diagram N760M, diagram LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, OIL7B, OIL9B, OIL11B, OIL30B, and OIL31B of Mitsubishi Chemistry CO. LTD.; PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 of Degussa CO. LTD.; and RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, and RAVEN-1170 of Colombia Carbon CO. LTD., can be used.

A coloring agent that can be used by mixing with the carbon black includes carmine 6B (C.I. 12490), phthalocyanine green (C.I. 74260), phthalocyanine blue (C.I. 74160), mitsubishi carbon black MA100, phenylene black (BASF K0084, K0086), cyanine black, linolyellow (C.I. 21090), linol yellow GRO (C.I. 21090), benzidine yellow 4T-564D, mitsubishi carbon black MA-40, victoria pure blue (C.I. 42595), C.I. PIGMENT RED 97, 122, 149, 168, 177, 180, 192, 215, C.I. PIGMENT GREEN 7, 36, C.I. PIGMENT 15:1, 15:4, 15:6, 22, 60, 64, C.I. PIGMENT 83, 139 C.I. PIGMENT VIOLET 23, and may use a white pigment and a fluorescent pigment.

When a black matrix photosensitive resin composition is produced using the coloring dispersion liquid, a carbon content for embodying a high optical density (OD) preferably includes 50-85 weight % of entire solid (sum of components except for a solvent) of the photosensitive resin composition.

(c) Binder Resin

The binder resin used in the present invention has alkali-solubility and is a copolymer resin of a monomer for providing mechanical strength and a monomer for providing an alkali soluble property.

As the monomer that can contribute to mechanical strength, at least one unsaturated carboxylic ester selected from a group consisting of benzyl(met)acrylate, methyl(met)acrylate, ethyl(met)acrylate, butyl(met)acrylate, dimethylaminoethyl(met)acrylate, isobutyl(met)acrylate, t-butyl(met)acrylate, cyclohexyl(met)acrylate, isobornyl(met)acrylate, ethylhexyl-meta)acrylate, 2-phenoxyethyl(met)acrylate, tetrahydrofurfuryl(met)acrylate, hydroxyethyl(met)acrylate, 2-hydroxypropyl(met)acrylate, 2-hydroxy-3-chloropropyl(met)acrylate, 4-hydroxybutyl(met)acrylate, acyloctyloxy-2-hydroxypropyl(met)acrylate, glycerol(met)acrylate, 2-methoxyethyl(met)acrylate, 3-methoxybutyl(met)acrylate, ethoxydiethyleneglycol(met)acrylate, methoxytriethyleneglycol(met)acrylate, methoxytripropyleneglycol(met)acrylate, poly(ethyleneglycol)methylether(met)acrylate, phenoxydiethyleneglycol(met)acrylate, p-nonylphenoxypolyethyleneglycol(met)acrylate, p-nonylphenoxypolypropyleneglycol(met)acrylate, glycidyl(met)acrylate, tetrafluoropropyl(met)acrylate, 1,1,1,3,3,3-hexafluoroisopropyl(met)acrylate, octafluoropentyl(met)acrylate, heptadecafluorodecyl(met)acrylate, tribromophenyl(met)acrylate, dicyclofentanylmethacrylate, dicyclopentenylmethacrylate, dicyclopentenyloxyethylacrylate, isobornylmethacrylate, adamantylmethacrylate, methyl α-hydroxymethyl acrylate, ethyl α-hydroxymethyl acrylate, propyl α-hydroxymethyl acrylate, and butyl α-hydroxymethyl acrylate;

at least one aromatic vinyl selected from a group consisting of styrene, α-methylstyrene, (o,m,p)-vinyl toluene, (o,m,p)-methoxy styrene, and (o,m,p)-chloro styrene;

at least one unsaturated ether selected from a group consisting of vinyl methyl ether, vinyl ethyl ether, and allyl glycidyl ether;

at least one unsaturated imide selected from a group consisting of N-phenyl maleimide, N-(4-chlorophenyl)maleimide, N-(4-hydroxyphenyl)maleimide, and N-cyclohexyl maleimide; and one, preferably at least two selected from a group consisting of maleic anhydride such as maleic anhydride and methylmaleic anhydride can be used, but the monomer is not limited thereto.

Further, as the monomer for providing alkali solubility, it is preferable to use at least one selected from a group consisting of (met)acrylic acid, crotonic acid, itaconic acid, maleate, fumaric acid, monomethyl maleate, 5-norbornene-2-carboxylic acid, mono-2-((met)acryloyloxy)ethyl phthalate, mono-2-((met)acryloyloxy)ethyl succinate, and ω-carboxy polycaprolactone mono(met)acrylate, but the monomer is not limited thereto.

Further, a binder resin represented with Chemical Formula 1 in addition to the monomers may be included.

[Chemical Formula 1]

In Chemical Formula 1, Rx is a structure in which carboxylic acid anhydride of five-membered rings or diisocyanate forms a bond by performing an addition reaction, Ry is selected from hydrogen, acryloyl, and methacryloyl, and n is 3 to 8.

A specific example of carboxylic acid anhydride constituting Rx is at least one selected from a group consisting of succinic acid anhydride, methylsuccinic acid anhydride, 2,2-dimethylsuccinic acid anhydride, isobutenylsuccinic acid anhydride, 1,2-cyclohexanedicarboxlylic acid anhydride, hexanhydro-4-methylphthalic acid anhydride, itacoic acid anhydride, tetrahydrophthalic acid anhydride, 5-norbornene-2,3-dicarboxlylic acid anhydride, metel-5-norbornene-2,3-dicarboxlylic acid anhydride, 1,2,3,4-cyclo butantetracarboxlylic acid dianhydride, maleate anhydride, citraconic acid anhydride, 2,3-dimethylmaleate anhydride, 1-cyclopenten-1,2-dicarboxlylic acid dianhydride, 3,4,5,6-tetrahydrophthalic acid anhydride, phthalic acid anhydride, bisphthalic acid anhydride, 4-methylphthalic acid anhydride, 3,6-dichlorophthalic acid anhydride, 3-hydrophthalic acid anhydride, 1,2,4-benzenetricarboxlylic acid anhydride, 4-nitrophthalic acid anhydride, and diethyleneglycol-1,2-bistrimelic acid anhydride, but it is not limited thereto.

A specific example of diisocyanate constituting Rx is at least selected from a group consisting of trimethylenediisocyanate, tetramethylenediisocyanate, hexamethylenediisocyanate, pentamethylenediisocyanate, 1,2-propylenediisocyanate, 2,3-butylenediisocyanate, 1,3-butylenediisocyanate, dodecamethylenediisocyanate, 2,4,4-trimethyl hexamethylene diisocyanate, w,w'-diisocyanate-1,3-dimethylbenzene, w,w'-diisocyanate-1,4-dimethylbenzene, w,w'-diisocyanate-1,3-diethylbenzene, 1,4-tetramethyl xylene diisocyanate, 1,3-tetramethyl xylene diisocyanate, isoporondiisocyanate, 1,3-cyclopentandiisocyanate, 1,3-cyclohexanediisocyanate, 1,4-cyclohexanediisocyanate, methyl-2,4-cyclohexanediisocyanate, methyl-2,6-cyclohexanediisocyanate, 4,4'-methylene bisisocyanate methylcyclohexane, 2,5-isocyanatemethyl bicyclo[2,2,2]heptane, and 2,6-isocyanatemethyl bicyclo[2,2,1]heptane, but it is not limited thereto.

The alkali soluble binder resin according to the present invention has a weight average molecular weight of 1,000~50,000 g/mol, preferably 2,000~10,000 g/mol and an acid value of 30-150 KOHmg/mg and is preferably included in 5-25 weight % of solid (sum of components except for a solvent) in an entire black matrix photosensitive resin composition.

(d) Functional Monomer Having Ethylenically Unsaturated Bond

The functional monomer according to the present invention has an ethylenically unsaturated bond, and specifically has at least one addition polymerization unsaturated group in a molecule and can use a functional monomer having caprolactone or a compound having a boiling point of 100° C. or more.

A compound having at least one addition polymerization unsaturated group in a molecule and having a boiling point of 100° C. or more can use at least one monofunctional monomer selected from a group consisting of polyethyleneglycol mono(met)acrylate, polypropyleneglycol mono(met)acrylate, and phenoxyethyl(met)acrylate; and at least one polyfunctional monomer selected from a group consisting of polyethyleneglycol(met)acrylate, polypropylene glycol(met)acrylate, trimethylolethane triacrylate, trimethylolpropane triacrylate, neopentylglycol (met)acrylate, pentaerythritol tetraacrylate, pentaerythritol triacrylate, dipentaerythritol pentaacrylate, and dipentaerythritol hexaacrylate.

Further, the polyfunctional monomer having caprolactone can use KAYARAD DPCA-20, 30, 60, 120 injected into dipentaerythritol; KAYARAD TC-110S injected into tetrahydrofuryl acrylate; and KAYARAD HX-220 and KAYARAD HK-620 injected into neopentylglycol hydroxypivalate.

In addition to the monomers, U-324A, U15HA, and U-4HA, which are epoxyacrylate of a bisphenol A derivative, novolac-epoxyacrylate, and polyfunctional acrylate of urethanes can be used, and a functional monomer having an ethylenetically unsaturated double bond can use one, or use by mixing at least two.

The functional monomer having an ethylenetically unsaturated double bond is preferably included in 5-25 weight % of solid (sum of components except for a solvent) in a black matrix photosensitive resin composition. If a content of the functional monomer is less than 5 weight %, light sensitivity or strength of a coating film is deteriorated, and if a content of the functional monomer exceeds 25 weight %, adhesiveness of the photosensitive resin layer is excessive and thus strength of a film is not enough, and upon developing, a pattern undesirably suffers a loss.

(e) Photopolymerization Initiator

A photopolymerization initiator used in the present invention is a material for causing a bridge by generating radicals by means of light and is preferably used by mixing at least one compound selected from a group consisting of an acetophenone compound, a biimidazole compound, a triazine compound, and an oxime compound.

The acetophenone compound that can be used as the photopolymerization initiator is selected from a group consisting of 2-hydroxy-2-methyl-1-phenylpropane-1-one, 1-(4-isopropylphenyl)-2-hydroxy-2-methylpropane-1-one, 4-(2-hydroxyethoxy)-phenyl-(2-hydroxy-2-propyl)ketone, 1-hydroxycyclohexylphenylketon, benzoinmethyl ether, benzomethyl ether, benzoinisobutyl ether, benzoinbutyl ether, 2,2-dimethoxy-2-phenylacetophenone, 2-methyl-(4-methylthio)phenyl-2-morpholino-1-propane-1-one, 2-benzyl-2-dimethylamino-1-(4-morpholinophenyl)-butane-1- one, 2-(4-bromo-benzyl-2-dimethylamino-1-(4-morpholinophenyl)-butane-1-one, and 2-methyl-1-[4-(methylthio)phenyl]-2-morpholinopropane-1-one, The biimidazole compound is selected from a group consisting of 2,2-bis(2-chlorophenyl)-4,4',5,5'-tetraphenyl biimidazole, 2,2'-bis(o-chlorophenyl)-4,4',5,5'-tetrakis(3,4,5-trimethoxyphenyl)-1,2'-biimidazole, 2,2'-bis(2,3-dichlorophenyl)-4,4',5,5'-tetraphenyl biimidazole, and 2,2'-bis(o-chlorophenyl)-4,4,5,5'-tetraphenyl-1,2'-biimidazole, The triazine compound is selected from a group consisting of 3-{4-[2,4-bis(trichloromethyl)-s-triazin-6-one]phenylthio}propanoic acid, 1,1,1,3,3,3-hexafluoroisopropyl-3-{-4-[2,4-bis(trichloromethyl)-s-triazin-6-one]phenylthio}propionate, ethyl-2-{-4-[2,4-bis(trichloromethyl)-s-triazin-6-one]phenylthio}acetate, 2-epoxyethyl-2-{4-[2,4-bis(trichloromethyl)-s-triazin-6-one]phenylthio}acetate, cyclohexyl-2-{4-[2,4-bis(trichloromethyl)-s-triazin-6-one]phenylthio}acetate, benzyl-2-{4-[2,4-bis(trichloromethyl)-s-triazin-6-one]phenylthio}acetate, 3-{chloro-4-[2,4-bis(trichloromethyl)-s-triazin-6-one]phenylthio}propionic acid, 3-{4-[2,4-bis(trichloromethyl)-s-triazin-6-one]phenylthio}propionamide, 2,4-bis(trichloromethyl)-6-p-methoxystyryl-s-triazin, 2,4-bis(trichloromethyl)-6-(1-p-dimethylaminophenyl)-1,3,-butadienyl-s-triazin, and 2-trichloromethyl-4-amino-6-p-methoxystyryl-s-triazin, The oxime compound includes 1,2-octadion-1-(4-phenylchio)phenyl-2-(o-benzoyloxime) (Ciba-Geigy company, CGI 124) and ethanone-1-(9-ethyl)-6-(2-methylbenzoyl-3-one)-1-(o-acetyloxime) (CGI 242).

It is preferable that the photopolymerization initiator is used as 1-300 weight % of total 100 weight % of an unsaturated double bond included in (d) a functional monomer having an ethylenically unsaturated double bond and (b) an alkali soluble binder resin and particularly, uses 1-30 weight % of an acetophenone compound, 1-30 weight % of a biimidazole compound, 1-30 weight % of a triazine compound, and 1-30 weight % of an oxime compound.

Further, the photopolymerization initiator may further include 0.01-10 weight % of a photocrosslinking sensitizer that promotes generation of radicals and 0.01-10 weight % of a curing accelerator that promotes curing to 100 weight % of the photopolymerization initiator as an auxiliary component.

The photocrosslinking sensitizer can use a benzophenone compound such as benzophenone, 4,4-bis(dimethylamino) benzophenone, 4,4-bis(diethylamino)benzophenone, 2,4,6-trimethylaminobenzophenone, methyl-o-benzoylbenzoate, 3,3-dimethyl-4-methoxybenzophenone, and 3,3,4,4-tetra(t-butylperoxicarbonyl)benzophenone; a fluorenone compound such as 9-fluorenone, 2-chloro-9-fluorenone, and 2-methyl-9-fluorenone; a tioxanton compound such as tioxanton, 2,4-diethyl tioxanton, 2-chloro tioxanton, 1-chloro-4-propyloxi tioxanton, isopropyl tioxanton, and diisopropyltioxanton; an xanthone compound such as xanthone and 2-methylxanthone; an anthraquinone compound such as anthraquinone, 2-methyl anthraquinone, 2-ethyl anthraquinone, t-butyl anthraquinone, and 2,6-dichloro-9,10-anthraquinone; an acridine compound such as 9-phenylacridine, 1,7-bis(9-acrynidyl)heptane, 1-5-bis(9-acrynidylpentan), and 1,3-bis(9-acrynidyl)propane; a dicarbonyl compound such as benzyl, 1,7,7-trimethyl-bicyclo[2,2,1]heptane-2,3-dion, and 9,10-phenanthrenequinone; a phosphine oxide compound such as 2,4,6-trimethylbenzoyl diphenylphosphine oxide, bis (2,6-dimetkmbenzoyl)-2,4,4-trimethylpentyl phosphine oxide; a benzophenone compound such as methyl-4-(dimethylamino)benzoate, ethyl-4-(dimethylamino)benzoate, and 2-n-butoxyethyl-4-(dimethylamino)benzoate; amino synergist such as 2,5-bis(4-diethylaminobenzal)cyclophenone, 2,6-bis(4-diethylaminobenzal)cyclohexaneone, and 2,6-bis(4-diethylaminobenzal)-4-methyl-cyclophenone; a coumarin compound such as 3,3-carbonylvinyl-7-(diethylamino)coumarin, 3-(2-benzothiazolyl)-7-(diethylamino) coumarin, 3-benzoyl-7-(diethylamino)coumarin, 3-benzoyl-7-methoxy-coumarin, 10,10-carbonylbis[1,1,7,7,-tetramethyl-2,3,6,7,-tetrahydro-1H,5H,11H—C1]-benzopirano-[6,7,8-ij]-quinolizine-11-one; and a chalcone compound such as 4-diethylamino chalcone, 4-azidbenzalacetophenone; and 2-benzoylmethylene or 3-methyl-b-naphthopiazoline.

Further, the curing accelerator can use at least one selected from a group consisting of 2-mercaptobenzoimidazole, 2-mercaptobenzothiazole, 2-mercaptobenzooxazole, 2,5-mercapto-1,3,4-tiadiazole, 2-mercapto-4,6-dimethylaminopiridin, pentaerythritol-tetrakis(3-mercaptopropionate), pentaerythritol-tris(3-mercaptopropionate), pentaerythritol-tetrakis(2-mercaptoacetate), pentaerythritol-tris(2-mercaptoacetate), trimethylolpropane-tris(2-mercaptoacetate), and trimethylolpropane-tris(3-mercaptopropionate).

Further, a photosensitive resin composition of the present invention may further include at least one additive selected from a group consisting of a dispersing agent, an adhesion promoter, antioxidant, ultraviolet ray absorbent, a thermal polymerization inhibitor, and a labeling agent.

The adhesion promoter can use at least one selected from a group consisting of vinyltrimethoxysilane, vinyltriethoxysilane, vinyltris(2-methoxyethoxy)-silane, N-(2-aminoethyl)-3-aminopropylmethyldimethoxysilane, N-(2-aminoethyl)-3-aminopropylmethyltrimethoxy silane, 3-aminopropyltriethoxysilane, 3-glycidoxypropyltriethoxysilane, 3-glycidoxypropylmethyldimethoxysilane, 2-(3,4-ethoxy cyclohexyl)ethyltrimethoxysilane, 3-chloropropyl methyldimethoxysilane, and 3-chloropropyl trimethoxy silane, 3-metaacryloxipropyltrimethoxysilane, and 3-mercaptopropyltrimethoxysilane.

The antioxidant can use 2,2-thiobis(4-methyl-6-t-butylphenol), or 2,6-g,t-butylphenol, and the ultraviolet ray absorbent can use 2-(3-t-butyl-5-methyl-2-hydroxyphenyl)-5-chloro-benzotriazole, or alkoxy benzophenone. Further, the thermal polymerization inhibitor can use hydroquinone, p-methoxyphenol, di-t-butyl-p-cresol, pyrogallol, t-butylcatechol, benzoquinone, 4,4-thiobis(3-methyl-6-t-butylphenol), 2,2-methylenebis(4-methyl-6-t-butylphenol), or 2-mercaptoimidazole.

Further, the photosensitive resin composition may further include a second additive formed with at least one selected from a group consisting of carbon black dispersions, a resin binder having a function, other polyfunctional monomers except for the polyfunctional monomer, radiation-sensitive compound, and other additives.

Further, the present invention provides a black matrix for a liquid crystal display produced through step of applying the black matrix photosensitive resin to a panel and step of exposing and developing the applied photosensitive resin, and the black matrix according to the present invention is excellent in a surface defect-free characteristic, a developing property, a light shielding property, and an insulation property, has no residue, and has no display failure by heat treatment. Therefore, a black matrix produced according to the present invention can be variously applied to a liquid crystal display.

Particularly, an OD per 1 μm of a film formed with a photosensitive composition according to the present invention is 4.5 or more, preferably 5.0 or more, and because the film sustains such a high light shielding property, the film can be variously applied to a black matrix.

The present invention optimizes a ratio of a solvent in developing a black matrix photosensitive resin composition of a high light shielding property to apply to each process condition tuned to a limit value in order to realize maximization of a production, thereby controlling a rheology characteristic of a film and thus obtains a uniform film having no defect.

Hereinafter, for a better understanding of the present invention, a preferable exemplary embodiment is suggested, but the following exemplary embodiments are not to limit the present invention but to illustrate it. Further, the following exemplary embodiments illustrate only a photosensitive resin composition having some solvent composition constituting the first solvent, the second solvent, and third solvent according to the present invention, but it will become apparent to those skilled in the art that equivalents belonging to a temperature range of other solvents in addition to these solvents can also represent effects of the present invention.

Exemplary Embodiment 1

950 parts by weight of a carbon dispersion liquid (including 20 parts by weight of a carbon content), 50 parts by weight of an alkali soluble binder resin having a weight average molecular weight 5000 and an acid value 80 KOHmg/g in which bisphenol fluorene epoxy acrylate/1,3-cyclohexyldiisocyanate to which acrylic acid was added was formed in a mole ratio of 65/35, 30 parts by weight of dipentaerythritolhexaacrylate as a functional monomer, 25 parts by weight of ethanone-1-(9-ethyl)-6-(2-methylbenzoyl-3-one)-1-(o-acetyloxime) as a photopolymerization initiator, 5 parts by weight of 3-methacryloxypropyltrimethoxysilane, which is an adhesion promoter, 1 parts by weight of a labeling agent, 400 parts by weight (24.3 weight %) of propyleneglycol methylether acetate (146° C.) as a solvent, 850 weight % (51.6 weight %) of 3-methoxy butylacetate (170° C.), 245 parts by weight (15 weight %) of dipropyleneglycol methylether (188° C.), and 150 parts by weight (9.1 weight %) of diethyleneglycolbutylmethylether (212° C.) were mixed. Thereafter, by stirring the mixture during five hours, a black matrix photosensitive resin composition was produced.

A carbon content is 63.1 weight % based on 100 weight % of solid (sum of components except for a solvent) of the composition.

After a photosensitive resin composition solution produced using the above method was spin coated on glass and decompression dry (VCD) was performed up to 65 Pa, a film having a thickness of about 1.22 um was formed by pre-baking for two minutes at about 100° C. Thereafter, after the film was cooled at a room temperature, the film was exposed with energy of 30 mJ/cm² under a high pressure mercury lamp using a photo mask. After the exposed substrate was developed using a spray method in a water solution of 0.04% KOH at a temperature of 25° C., by cleaning and drying the substrate with pure water, and the substrate was post-baked for 20 minutes at a convection oven of 230° C.

Figure 1:
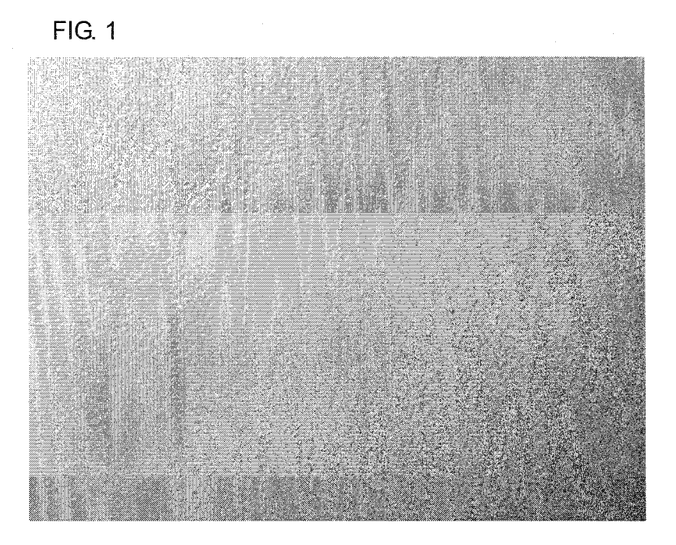
FIG. 1 is a photograph illustrating a black matrix surface obtained from a composition according to exemplary embodiment 1 of the present invention measured with an optical microscope.

A clean film having no surface defect according to each process was obtained using the above process, as can be seen in FIG. 1, and as the film has a thickness of 1.1 μm, a film pattern is never separated, and the film has an excellent straight property. Further, the film shows a clean pattern characteristic without pollution of an exposure portion and shows an excellent light shielding characteristic having an OD of 5.1.

Exemplary Embodiment 2

950 parts by weight of a carbon dispersion liquid (including 20 parts by weight of a carbon content), 50 parts by weight of an alkali soluble binder resin having an Mw 5000 and an acid value 80 KOHmg/g in which bisphenol fluorene epoxy acrylate/1,3-cyclohexyldiisocyanate to which acrylic acid is added is formed in a mole ratio of 65/35, 30 parts by weight of dipentaerythritolhexaacrylate as a functional monomer, 25 parts by weight of ethanone-1-(9-ethyl)-6-(2-methylbenzoyl-3-one)-1-(o-acetyloxime) as a photopolymerization initiator, 5 parts by weight of 3-methacryloxypropyltrimethoxysilane, which is an adhesion promoter, 1 parts by weight of a labeling agent, 400 parts by weight (24.3 weight %) of propyleneglycol methylether acetate (146° C.) as a solvent, 850 parts by weight (51.6 weight %) of 3-methoxybutylacetate (170° C.), 245 parts by weight (15 weight %) of dipropyleneglycol methylether (188° C.), and 150 parts by weight (9.1 weight %) of diethyleneglycolethylether acetate (217° C.) were mixed.

Thereafter, by stirring the mixture during five hours, a black matrix photosensitive resin composition was produced. A carbon content is 63.1 weight % based on 100 weight % of solid (sum of components except for a solvent) of the composition.

When a film is formed through the same process as that of Exemplary Embodiment 1, a clean pattern having no surface defect is formed, and the film shows an excellent light shielding characteristic having an OD of 5.2.

Exemplary Embodiment 3

950 parts by weight of a carbon dispersion liquid (including 20 parts by weight of a carbon content), 50 parts by weight of an alkali soluble binder resin having an Mw 5000 and an acid value 80 KOHmg/g in which bisphenol fluorene epoxy acrylate/1,3-cyclohexyldiisocyanate to which acrylic acid is added is formed in a mole ratio of 65/35, 30 parts by weight of dipentaerythritolhexaacrylate as a functional monomer, 25 parts by weight of ethanone-1-(9-ethyl)-6-(2-methylbenzoyl-3-one)-1-(o-acetyloxime) as a photopolymerization initiator, 5 weight % of 3-methacryloxypropyltrimethoxysilane, which is an adhesion promoter, 1 parts by weight of a labeling agent, 90 parts by weight (5.5 weight %) of propylene glycol methylether (121° C.) as a solvent, 1100 parts by weight (66.8 weight %) of 3-methoxybutylacetate (170° C.), 245 parts by weight (15 weight %) of dipropyleneglycol methylether (188° C.), and 210 parts by weight (12.8 weight %) of diethyleneglycolmonoethylether (202° C.) were mixed. Thereafter, by stirring the mixture during five hours, a black matrix photosensitive resin composition was produced. A carbon content is 63.1 weight % based on 100 weight % of solid (sum of components except for a solvent) of the composition.

When a film is formed through the same process as that of Exemplary Embodiment 1, a clean pattern having no surface defect is formed and the film shows an excellent light shielding characteristic having an OD of 5.15.

Comparative Example 1

A black matrix photosensitive resin composition was produced with the same composition as that of Exemplary Embodiment 1, except for using a solvent in which 800 parts by weight of propyleneglycol methylether acetate, 450 parts by weight of 3-methoxybutylacetate, 245 parts by weight of dipropyleneglycol methylether, and 150 parts by weight of diethyleneglycolbutylmethyl ether are mixed.

Figure 2:
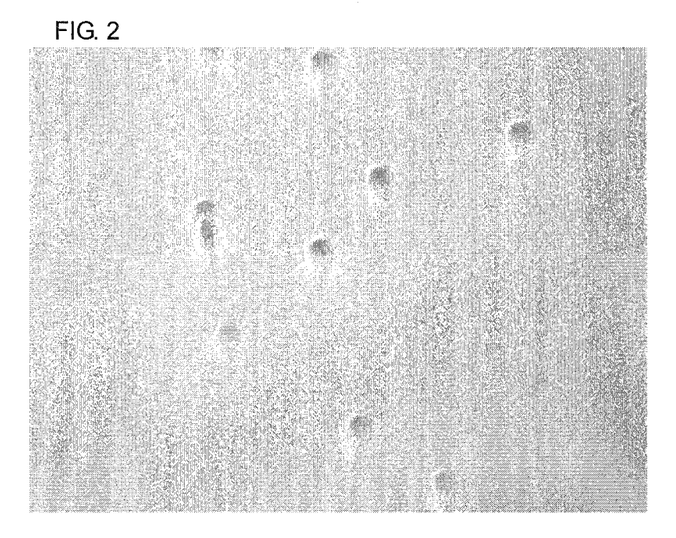
FIG. 2 is a photograph illustrating a black matrix surface obtained from a composition of Comparative Example 1 measured with an optical microscope.

When a film was formed through the same process as that of Exemplary Embodiment 1, a defect was occurred on the surface at a decompression drying step, as shown in FIG. 2.

Comparative Example 2

A black matrix photosensitive resin composition was produced with the same composition as that of Exemplary Embodiment 1, except for using a solvent in which 400 parts by weight of propyleneglycol methylether acetate, 770 parts by weight of 3-methoxybutylacetate, 245 parts by weight of dipropyleneglycol methylether, and 330 parts by weight of diethyleneglycolbutylmethylether were mixed.

Figure 3:
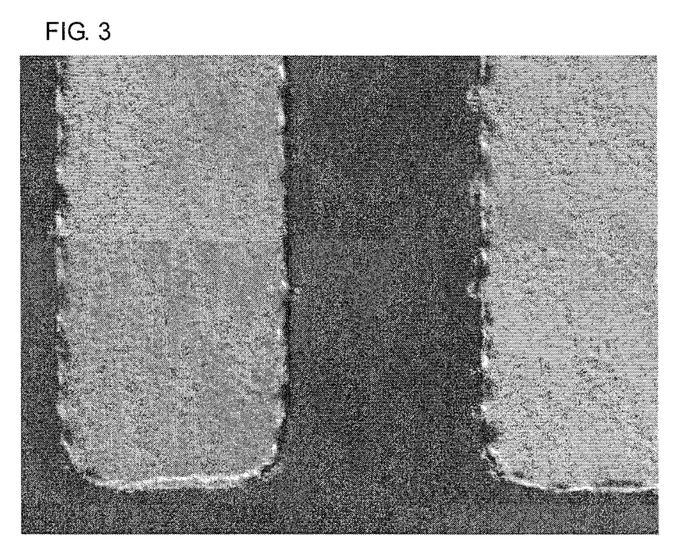
FIG. 3 is a photograph illustrating a black matrix pattern obtained from a composition of Comparative Example 2 measured with an optical microscope.

When a film was formed through the same process as that of Exemplary Embodiment 1, a defect did not occur on the surface at a decompression drying step, but an arrival time up to a reference pressure (65 Pa) is extended, and a solvent of a high boiling point has much content, as shown in FIG. 3, and thus a development margin becomes narrow and thus a straight characteristic was deteriorated.

Comparative Example 3

A black matrix photosensitive resin composition was produced with the same composition as that of Exemplary Embodiment 1, except for using a solvent in which 500 parts by weight of propyleneglycol methylether acetate, 1000 parts by weight of 3-methoxybutylacetate, and 245 parts by weight of dipropyleneglycol methylether were mixed.

When a film was formed through the same process as that of Exemplary Embodiment 1, a defect is smaller than that of Comparative Example 1, but was occurred at a decompression dry step.

The invention claimed is:

1. A photosensitive resin composition for a black matrix comprising a coloring dispersion, a binder resin, a functional monomer having an ethylenically unsaturated bond, a photopolymerization initiator, and solvents,
    wherein the solvents have a solvent system consisting of 5-30 weight % of a first solvent having a boiling point of 110-159° C., 55-90 weight % of a second solvent having a boiling point of 160-200° C., and 3-15 weight % of a third solvent having a boiling point of 201-280° C.,
    wherein, each of the first solvent, the second solvent, and the third solvent is an aliphatic compound,
    wherein the third solvent is at least one selected from the group consisting of diethyleneglycolmonoethylether, hexylbutyrate, diethyleneglycol methyletheracetate, diethyleneglycolbutyl methyl ether, tripropylglycoldimethyl ether, triethyleneglycoldimethylether, diethyleneglycolethyletheracetate, diethyleneglycolbutyletheracetate, 3-epoxy-1,2-propanediol, ethyl-4-acetylbutyrate, diethyleneglycolmonobutylether, tripropylglycolmethyl ether, diethyleneglycol, 2-(2-butoxyethoxy)ethylacetate, catechol, triethyleneglycol methylether, diethyleneglycoldibutylether, triethyleneglycol ethylether, diethyleneglycolmonohexylether, triethyleneglycol butyl methyl ether, triethyleneglycolbutylether, tripropylglycol, and tetraethyleneglycoldimethylether;
    wherein in the composition, a carbon black content, based on an overall solid content, is in the range of 50-85 weight %, and
    wherein the overall solid content is a sum of components except for the solvents.

2. The photosensitive resin composition of claim 1, wherein the aliphatic compound is at least one selected from the group consisting of alkyl ester, alkyl ketone, alkyl ether, and alkyl alcohol.

3. The photosensitive resin composition of claim 1, wherein the first solvent is at least one selected from the group consisting of methyl-3-methoxy propionate, ethyleneglycol methylether, ethyleneglycol ethylether, ethyleneglycol diethylether, dibutylether, ethylpyruvate, propyleneglycol methylether, propyleneglycol methylether acetate, n-butylacetate, isobutylacetate, amylacetate, isoamylacetate, butylpropionate, isoamylpropionate, ethylbutyrate, propylbutyrate, methyl-3-methoxyisobutyrate, methylglycolate, methyl lactate, ethyl lactate, methyl-2-hydroxyisobutyrate, ethylethoxyacetate, 2-methoxyethylacetate, ethyleneglycolmethylether acetate, 2-ethoxyethylacetate, dibutylether, cyclopentanone, cyclohexanone, 2-hexanone, 3-hexanone, 5-methyl-2-hexanone, 2-heptanone, 3-heptanone, 4-heptanone, 2-methyl-3-heptanone, 1-methoxy-2-propanol, ethyl-2-hydroxypropionate, and ethyl-3-methoxypropionate.

4. The photosensitive resin composition of claim 1, wherein the second solvent is at least one selected from the group consisting of 2-methoxy ethylether, 3-methoxybutyl acetate, 2-ethoxyethyl ether, 2-butoxyethanol, 3-ethoxy-propanol, diethyleneglycoldodecylether, dipropyleneglycolmethylether, 2,6-dimethyl-4-heptanone, 2-octanone, 3-octanone, 3-nonanone, 5-nonanone, 4-hydroxy-4-methyl-2-pentanone, 2-methylcyclohexanone, 3-methylcyclohexanone, 4-methylcyclohexanone 2,6-dimethylcyclohexanone, 2,2,6-trimethylcyclohexanone cycloheptanone, hexylacetate, amylbutyrate, isopropyllactate, butyllactate, ethyl-3-hydroxybutyrate, ethyl-3-ethoxypropionate, ethyl-3-hydroxy butyrate, propyl-2-hydroxy-propionate, propyleneglycoldiacetate, propyleneglycolbutylether, propyleneglycol methyletherpropionate, diethyleneglycol dimethyl ether, diethyleneglycol dimethyl ether acetate, dipropyleneglycolmethylether, dipropyleneglycoldimethylether, ethyleneglycolbutylether, diethyleneglycolmethylethylether, ethyleneglycol methylisopropylether, diethyleneglycoldiethylether, butylbutyrate, ethyl-3-ethoxypropionate, diethyleneglycolmonomethylether, 4-ethylcyclohexanone, and 2-butoxyethylacetate.

5. A black matrix formed with the photosensitive resin composition according to claim 1.

6. A liquid crystal display element having the black matrix according to claim 5.

7. The photosensitive resin composition of claim 1, which allows a film formed by the composition to have an optical density (OD) per 1 μm of 4.5 or more.

* * * * *

UNITED STATES PATENT AND TRADEMARK OFFICE
CERTIFICATE OF CORRECTION

PATENT NO.      : 8,822,127 B2
APPLICATION NO. : 12/997224
DATED           : September 2, 2014
INVENTOR(S)     : Dong Chang Choi et al.

It is certified that error appears in the above-identified patent and that said Letters Patent is hereby corrected as shown below:

In the Claims

Claim 4, column 14, lines 34-35, "4-methylcyclohexanone 2,6-dimethylcyclohexanone" should read "4-methylcyclohexanone, 2,6-dimethylcyclohexanone".

Claim 4, column 14, lines 35-36, "2,2,6-trimethylcyclohexanone cycloheptanone" should read "2,2,6-trimethylcyclohexanone, cycloheptanone".

Signed and Sealed this
Twenty-fourth Day of March, 2015

Michelle K. Lee
*Director of the United States Patent and Trademark Office*